United States Patent [19]

King

[11] 3,932,777

[45] Jan. 13, 1976

[54] VACUUM ELECTROLYSIS OF QUARTZ

[75] Inventor: James Claude King, Albuquerque, N. Mex.

[73] Assignee: Bliley Electric Company, Erie, Pa.

[22] Filed: Nov. 29, 1974

[21] Appl. No.: 528,552

[52] U.S. Cl. .................................... 310/8; 310/9.5
[51] Int. Cl.² ........................................ H01L 41/10
[58] Field of Search ............... 310/8, 8.5, 9.5, 9.6; 317/262 F; 204/164

[56] References Cited
UNITED STATES PATENTS

| 2,437,913 | 3/1948 | Frondel | 310/8 X |
| 2,898,243 | 8/1959 | Wenden | 310/8 X |
| 3,113,224 | 12/1963 | King | 310/9.5 |
| 3,263,103 | 7/1966 | Fraser et al. | 310/9.5 |
| 3,337,439 | 8/1967 | Fraser | 310/8 |

Primary Examiner—Mark O. Budd
Attorney, Agent, or Firm—Kenyon & Kenyon Reilly Carr & Chapin

[57] ABSTRACT

The disclosure is directed to a method for processing quartz used in fabricating crystal resonators such that transient frequency change of resonators exposed to pulse irradiation is virtually eliminated. The method involves heating the crystal quartz in a hydrogen-free atmosphere while simultaneously applying an electric field in the Z-axis direction of the crystal. The electric field is maintained during the cool-down phase of the process.

14 Claims, 1 Drawing Figure

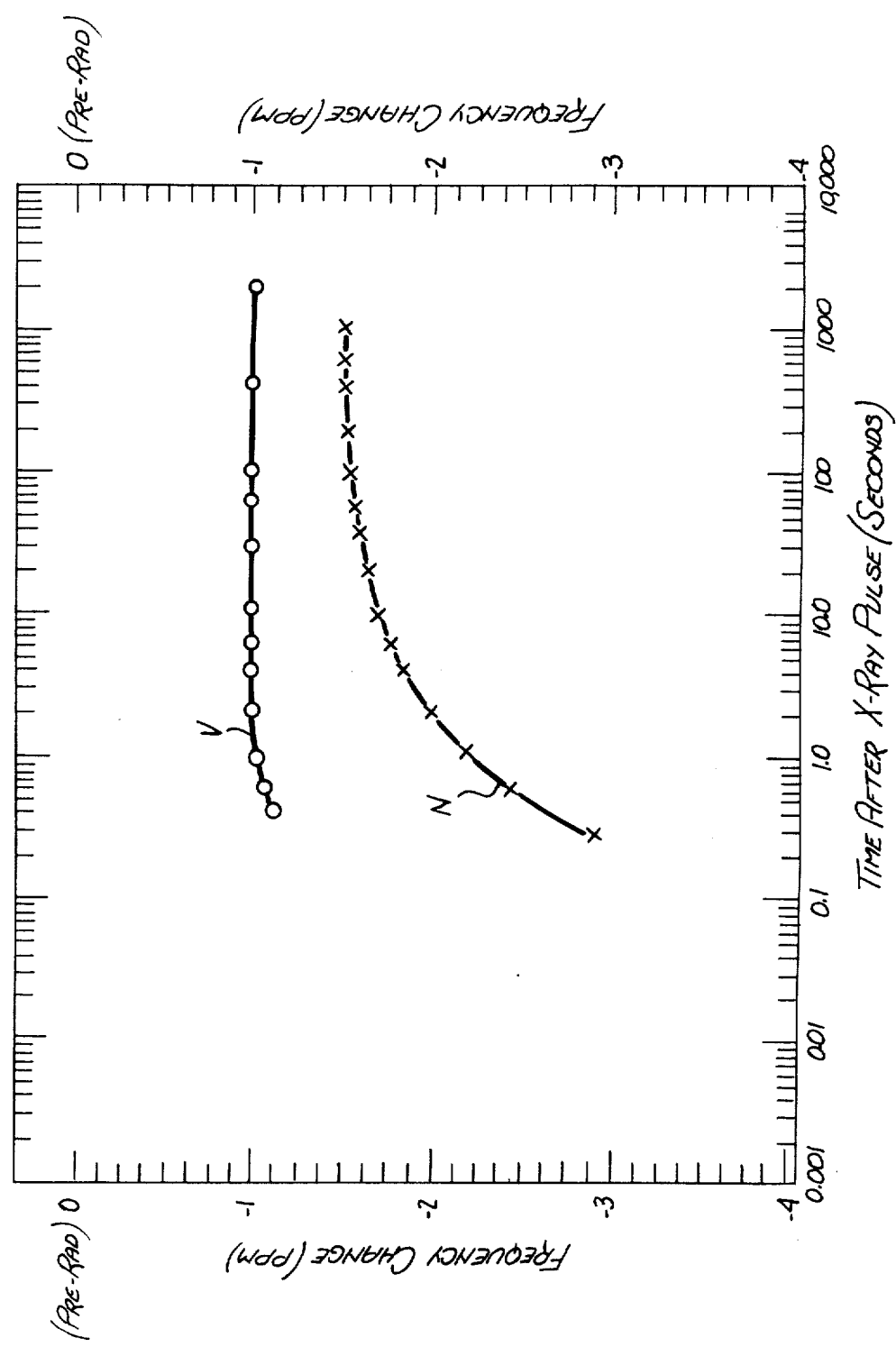

3,932,777

VACUUM ELECTROLYSIS OF QUARTZ

GOVERNMENT CONTRACT

The invention described herein was made in the course of, or under, a contract with the United States Atomic Energy Commission.

BACKGROUND OF THE INVENTION

1. Field of the Invention

This invention relates to a method of and material produced by electrolysis of quartz in a vacuum. Specifically, this invention relates to a method of treating crystal resonator quartz rendering it insensitive to transient frequency offset due to bursts of ionizing radiation.

2. Description of the Prior Art

Accumulated performance data on the stability of quartz resonators in earth orbiting satellites, as well as similar information gained from deep space probes, underscore the importance of reducing the effects of ionizing radiation on these critical system components.

Prior to the last decade, studies of the effect of ionizing radiation on crystal resonators dealt exclusively with the change in frequency resulting from exposure to continuous or steady state radiation. In general, natural quartz resonators, such as 5th overtone 5-MHz crystal units, exhibit a change in frequency withh irradiation. For example, optical grade natural Brazilian quartz resonators exhibit a negative change in frequency with irradiation, as much as 10 to 50 parts per million (ppm) on exposure to $10^6$ rad. Conversely, electronic Z-growth synthetic quartz resonators usually exhibit a positive offset of less than 10 ppm on exposure to $10^6$ rad.

Swept quartz is relatively unaffected by steady-state ionizing radiation. The term swept quartz refers to quartz treated by a method described in U.S. Pat. No. 3,113,224 to J. C. King on Dec. 3, 1963. This method generally comprises subjecting a quartz crystal in air to an electric field of at least 500 V/cm at a temperature of at least 400°C for a period of at least 12 hours. Such air-swept quartz in resonators commonly yields frequency offsets of no greater than 0.1 ppm after a cumulative exposure of $10^6$ to $10^7$ rad.

Thus means have been found to process quartz to render its use in a resonator relatively immune to steady-state radiation. However, it is also extremely important to assure that resonators are not adversely affected by pulses of radiation. On exposure to a pulse of ionizing radiation, it has been observed that virtually all quartz, whether natural, synthetic or swept synthetic, experiences a transient negative frequency shift which anneals within a few minutes after the pulse toward a relatively stable offset.

Following exposure to a 70-nanosecond X-ray pulse, natural quartz resonators approach a stable offset in 100 to 1,000 seconds. The post-irradiation stable resonant frequency is lower than its pre-pulse radiation value. Unswept synthetic quartz also experiences a transient negative frequency shift and the annealing continues for several hours until a stable positive offset results. While the transient offset for swept synthetic crystal is virtually identical to unswept and natural material, it anneals substantially to its pre-irradiation frequency.

In addition to air swept electrolysis of quartz, researchers have experimented with vacuum sweeping of quartz for a variety of purposes. U.S. Pat. No. 3,337,439 issued Aug. 22, 1967, to D. B. Fraser discloses vacuum sweeping of quartz to reduce acoustic absorption of high Q synthetic quartz at room temperature. U.S.S.R. researchers L. G. Chentsova, et al. in *Kristallografiya*, 17, 374–378 (1972) Eng. Transl. [Soviet Phy. (Cryst.) 17, 317 (1972)], report that A-band color centers can be induced in quartz by subjecting it to vacuum electrolysis at a temperature where the quartz is in the beta phase; i.e., above 573°C.

The prior art has been silent as to the theoretical aspects or a practical means for treating quartz to assure that after pulse irradiation, a quartz resonator will experience an acceptably small frequency offset.

It is an object of this invention to provide methods of treating quartz useful in resonator circuits so that when subjected to pulse irradiation, virtually no transient frequency offset occurs.

SUMMARY OF THE INVENTION

This object is met by maintaining the quartz at thermal equilibrium at a temperature of 500°C to 570°C in an atmosphere substantially free of hydrogen while applying an electric field along the Z-axis of the quartz crystal of a strength from 1 to 5 kV/cm for a period of 72 to 120 hours and maintaining the electric field while the crystal is cooled. An alternative method is disclosed whereby the quartz is heated above the inversion point to a temperature of 700°C to 900°C in an atmosphere substantially free of hydrogen while simultaneously applying an electric field along the Z-axis of the beta phase crystal quartz of a strength from 1 to 5 kV/cm for a period of 6 to 12 hours, and cooling the quartz while maintaining the electric field along the Z-axis and applying a compression stress or electric field along the X-axis as the quartz cools through the inversion region.

Simultaneous exposure to X-irradiation of the quartz while it is in the alpha phase with the electric field directed along the Z-axis is an additional step which aids in the removal of certain impurities from the quartz latice sites.

BRIEF DESCRIPTION OF THE DRAWING

The drawing shows frequency offset as a function of time after an X-ray pulse for two quartz resonators, one of which the quartz has been subjected to electrolysis in a vacuum and another which is untreated natural quartz.

DESCRIPTION OF THE INVENTION

It has generally been held that sweeping quartz in a hydrogen-free environment removes $Li^+$ and $Na^+$ ions and, in the absence of protons for compensation, there is a counter-flow of electrons to maintain charge neutrality in the crystal. The theoretical result is that A-band color centers, namely, hole-compensated Al3+, are induced by sweeping the crystal in an electric field. The electrically formed A-band centers are unusually thermally stable i.e., quite resistant to bleaching at temperatures well above 800°C.

It has been discovered that electrolysis in a hydrogen-free environment renders quartz resonators immune to transient $\Delta f/f$ after intense pulse irradiation. It is believed that this result is achieved because hydrogen-free sweeping eliminates the room temperature unstable part of the A-band defect precursor. Out of over 70 crystal units comprising both natural and air-swept synthetic crystals, crystals which have been swept by electrolysis in a vacuum are the only ones in which the transient $\Delta f/f$ is negligibly small.

The drawing shows actual test rests of $\Delta f/f$ versus time after an X-ray pulse for two different crystals used in a resonator circuit. Each crystal was subjected to a pulse of X-radiation of amount $3 \times 10^4$ rad. The curve labeled "V" represents the response for a crystal which was vacuum-swept according to the method of this invention. The curve labeled "N" represents the response of an unswept natural quartz resonator. It is apparent that the vacuum-swept crystal resonator experiences far less initial transient and total offset in frequency than does the natural quartz. This same result is true when vacuum-swept crystal resonators are compared with those using natural, synthetic or air-swept crystals.

It has been found that the efficiency of the vacuum sweeping depends in large measure on how it is carried out. It has been discovered that crystal quartz can be vacuum-swept in either of the alpha or beta crystalline phases of quartz; alpha phase wherein the crystal temperature is below 573°C, and beta phase wherein the crystal temperature is above 573°C.

Vacuum sweeping in the alpha phase is achieved by maintaining the quartz at thermal equilibrium at a temperature of 500°C to 570°C in an atmosphere substantially free of hydrogen. Rather than a vacuum condition, it is sufficient that the atmosphere be one in which the element H is not present in any substantial amount. Gas atmospheres of helium neon, argon and nitrogen can be used. With the crystal so heated, an electric field is applied along the Z-axis of the crystal of a strength from 1 to 5 kV/cm for a period of 72 to 120 hours. After maintaining the field for that period of time, the crystal is then allowed to cool, but with the electric field remaining. This prevents defects which have become segregated at or near the cathode from back diffusing through the crystal lattice during the cooling phase.

The preferred process operating temperatures are a thermal equilibrium of 550°C and an electric field strength of 2 kV/cm.

In applying the electric field, electrodes are attached to the faces perpendicular to the Z-axis of the crystal. These electrodes are preferably of thin platinum sheet stock of 99.9 to 99.99% purity. Other metals in the platinum series may be used as electrode material. The crystal block to be treated should preferably be dimensioned oversize in the Z direction, relative to the final size of the ultimate resonative blank to be sectioned from the block because as will be explained, portions of the original block should be cut away.

It is preferred that the crystal to be treated be pure Z-growth material containing no X or Y-growth material. This can be determined by subjecting the block to between $10^4$ to $10^6$ rad ionizing radiation. The X-growth and Y-growth material contains a higher concentration of color-center precursors and will therefore darken more. Colored regions are a clear indication that the block is not pure Z-growth.

It has been pointed out that the electric field is applied in the Z-direction in an inert atmosphere. If synthetic quartz is being processed, care should be taken to attach the cathode electrode to that surface which was nearest the seed plate during synthesis of the quartz. Since growth near the seed crystal has a higher concentration of dislocations misaligned quartz segments, etc, impurities are best driven in that direction, particularly since it is from this region that material will be discarded. If synthetic quartz is used, care should be taken that the material to be processed be taken from one particular region of the grown crystal; i.e., no part of the seed crystal should be used because of the discontinuities of the crystal which often occur between the seed crystal and synthetic crystal grown thereon.

Multiple electrolysis improves the quality of the quartz from a frequency offset standpoint when pulsed with radiation. After the crystal is removed from the furnace, it is desirable to remove as much as 10 to 40 thousandths of an inch from the cathode surface. Following this, clean platinum plates are reapplied, and the electrolysis process is repeated as before. It is usually unnecessary to conduct electrolysis on the same block of quartz more than three times.

Vacuum electrolysis can be conducted in a shorter period of time if the electrolysis is done while the crystal is in the beta phase. The severe problem of cooling a block through the alpha-beta inversion without causing optical or electrical twinning can be mitigated by subjecting the quartz block to a compression stress in the X-direction during the cooling cycle, or impressing either an ac or dc electric field along the X axis as the quartz cools through the inversion region. The strain achieved in the quartz should be about $10^{-4}$ for either mechanical or electric field induced stress. Both of these techniques predispose the quartz to assume singlehandedness and no 180° rotation about the Z-axis between adjacent regions within the block. The length of time during which the electric field is maintained along the Z-axis while the crystal is at elevated temperature is preferably from 6 to 12 hours.

In quartz containing a reasonably high concentration of A-band color-center precursors, the thoroughness of the vacuum electrolysis, or the degree of completeness of the treatment, can be gaged by the extent to which the A-band color cloud has progressed from the anode to the cathode. In some quartz, a distinctive color front progresses from anode to cathode as the electrolysis proceeds. The colored region will be found basically devoid of OH absorption; whereas the clear region is sometimes found to have an enhanced integrated OH absorption. Samples of high purity quartz will show very little, if any, discoloration upon vacuum electrolysis; and, hence, in such material it is futile to try and gage the effectiveness of electrolysis by A-band absorption.

The thoroughness of the vacuum electrolysis process can also be gaged or measured by infrared absorption in the 3-$\mu$m range. If vacuum electrolysis has gone to completion, then the integrated OH absorption--that is, the actual area under the absorption in the 3-$\mu$m region, should be considerably reduced in comparison with the pretreatment value. It is particularly significant to observe a reduction in the 2.77 $\mu$m and the 2.87 $\mu$m absorption peaks. In essence, prolonged electrolysis in vacuum effectively removes the OH spectrum.

Vacuum electrolyzed quartz substantially eliminates those defects which when subjected to pulse ionization give rise to a transient color center (i.e., room temperature unstable) and the attendant transient frequency offset. Hence radiation of vacuum swept material will not produce color centers which will anneal at room temperature, and therefore the steady-state irradiation-induced $\Delta f/f$ offset will not anneal at the operating temperature of a crystal resonator. (normally 60° to 80°C)

Those colorable defect centers which are difficult to generate by vacuum electrolysis at elevated temperatures can be activated by subjecting the quartz at $10^5$ to $10^6$ rad simultaneously to the electrolysis process. In simpler terms, the ionizing radiation can very effectively dissociate certain impurities from lattice sites which with time will drift in the direction of the electric field and be removed.

In addition to the advantages of a much superior transient response of a crystal resonator in which the crystal has been subjected to vacuum sweeping according to the methods of this invention, it has been found that the Q of the quartz crystal has improved following exposure to approximately $10^5$ rad pulse X-irradiation of about 20 percent. In addition, by using the methods of this invention, synthetic quartz resonators are rendered normalized in terms of the uniformity of its frequency versus temperature characteristic curve, for a particular crystallographic angle of cut, between samples of quartz from different runs and suppliers.

What is claimed is:

1. A method of processing crystal quartz material comprising the steps of,
    maintaining the quartz at thermal equilibrium at a temperature of 500°C to 570°C in an atmosphere substantially free of hydrogen, while
    applying an electric field along the Z-axis of the crystal quartz between anode and cathode electrodes of a strength from 1 to 5 kV/cm for a period of 72 to 120 hours, and
    maintaining said electric field while said crystal is cooled.

2. The method of claim 1 wherein said temperature equilibrium is 550°C and said electric field is 2 kV/cm.

3. The method of claim 1 further comprising the subsequent step of,
    removing from 10 to 40 thousandths of an inch of the crystal perpendicular to the Z axis from the surface adjacent to said cathode electrode, and then repeating the steps of claim 1.

4. The method of claim 3 further comprising the subsequent step of,
    removing from 10 to 40 thousandths of an inch of the crystal perpendicular to the Z-axis from the surface adjacent to said cathode electrode, and then repeating the steps of claim 1.

5. The method of claim 1 wherein the atmosphere is a dry gas selected from the group consisting of helium neon, argon and nitrogen.

6. The method of claim 1 wherein said crystal quartz is natural quartz.

7. The method of claim 1 wherein said crystal quartz is synthetic quartz.

8. The method of claim 7 wherein said synthetic quartz is of homogeneous Z-growth material.

9. The method of claim 1 further comprising the step of
    subjecting the crystal quartz to ionizing radiation of $10^5$ to $10^6$ rad simultaneously to said step of applying an electric field to said crystal quartz.

10. A method of processing crystal quartz material comprising the steps of
    maintaining the quartz at thermal equilibrium in the beta phase at a temperature of 700° to 900°C in an atmosphere substantially free of hydrogen while
    applying an electric field between anode and cathode electrodes along the Z-axis of the crystal quartz of a strength from 1 to 5 kV/cm for a period of 6 to 12 hours, and
    cooling said quartz while maintaining said electric field and applying a compression stress which induces a strain no less than $10^{-4}$ in the X direction of said crystal as the quartz cools from the beta phase through 573°C to the alpha phase.

11. The method of claim 10 wherein said thermal equilibrium temperature is 800°C and wherein said electric field strength is 2 kV/cm.

12. A method of processing crystal quartz material comprising the steps of
    maintaining the quartz at thermal equilibrium in the beta phase at a temperature of 700° to 900°C in an atmosphere substantially free of hydrogen, while
    applying an electric field between anode and cathode electrodes along the Z axis of the crystal quartz of a strength from 1 to 5 kV/cm for a period of 6 to 12 hours, and
    cooling said quartz while maintaining said electric field along the Z axis and applying an electric field along the X axis sufficient to create a strain no less than $10^{-4}$ as the quartz cools from the beta phase through 573°C to the alpha phase.

13. The method of claim 1 wherein said electrodes are thin platinum sheets of 99.9 to 99.99% purity.

14. A quartz crystal for use in a crystal resonator comprising a quartz crystal which has been treated by the steps of,
    maintaining the quartz at thermal equilibrium at a temperature of 500°C to 570°C in an atmosphere substantially free of hydrogen, while
    applying an electric field between anode and cathode electrodes along the Z axis of the crystal quartz of a strength from 1 to 5 kV/cm for a period of 72 to 120 hours, and
    maintaining said electric field while said crystal is cooled.

* * * * *